(12) United States Patent
Nakano et al.

(10) Patent No.: US 7,790,263 B2
(45) Date of Patent: Sep. 7, 2010

(54) AG ALLOY REFLECTIVE FILM FOR OPTICAL INFORMATION RECORDING MEDIUM, OPTICAL INFORMATION RECORDING MEDIUM AND AG ALLOY SPUTTERING TARGET FOR FORMING AG ALLOY REFLECTIVE FILM FOR OPTICAL INFORMATION RECORDING MEDIUM

(75) Inventors: Jun Nakano, Tokyo (JP); Tetsuhiro Sakamoto, Kanagawa (JP); Junichi Nakai, Hyogo (JP); Yuki Tauchi, Hyogo (JP)

(73) Assignees: Sony Corporation, Tokyo (JP); Kobe Steel, Ltd., Kobe-shi (JP)

( * ) Notice: Subject to any disclaimer, the term of this patent is extended or adjusted under 35 U.S.C. 154(b) by 831 days.

(21) Appl. No.: 11/612,791

(22) Filed: Dec. 19, 2006

(65) Prior Publication Data
US 2007/0141296 A1   Jun. 21, 2007

(30) Foreign Application Priority Data
Dec. 21, 2005   (JP)   ............... 2005-368130

(51) Int. Cl.
*B32B 3/02*   (2006.01)
(52) U.S. Cl. ............... 428/64.1; 428/64.4; 430/270.12
(58) Field of Classification Search ........ None
See application file for complete search history.

(56) References Cited

U.S. PATENT DOCUMENTS

| 5,948,497 | A | 9/1999 | Hatwar et al. |
| 6,007,889 | A | 12/1999 | Nee |
| 6,229,785 | B1 | 5/2001 | Kitaura et al. |
| 6,280,811 | B1 | 8/2001 | Nee |

(Continued)

FOREIGN PATENT DOCUMENTS

JP   4-28032   1/1992

(Continued)

OTHER PUBLICATIONS

U.S. Appl. No. 12/261,781, filed Oct. 30, 2008, Matsuzaki.

(Continued)

*Primary Examiner*—Elizabeth Mulvaney
(74) *Attorney, Agent, or Firm*—Oblon, Spivak, McClelland, Maier & Neustadt, L.L.P.

(57) ABSTRACT

The invention relates to an Ag alloy reflective film for an optical information recording medium, including Ag as a main component, at least one kind of Nd, Gd, Y and Sm in a total amount of more than 0.1 atomic percent and not more than 3.0 atomic percent and at least one kind of W, Mo, V, Zr, Nb and Cr in a total amount of 3.0 to 10.0 atomic percent; an Ag alloy reflective film for an optical information recording medium, including Ag as a main component, at least one kind of Nd, Gd, Y and Sm in a total amount of more than 0.1 atomic percent and not more than 3.0 atomic percent and at least one kind of Ti and Ta in a total amount of 5.0 to 10.0 atomic percent; an optical information recording medium including the Ag alloy reflective film; and an Ag alloy sputtering target having a composition same as that of the Ag alloy reflective film.

14 Claims, 2 Drawing Sheets

U.S. PATENT DOCUMENTS

| | | |
|---|---|---|
| 6,451,402 B1 | 9/2002 | Nee |
| 6,689,444 B2 | 2/2004 | Nakai et al. |
| 6,788,635 B1 * | 9/2004 | Aratani et al. .............. 369/100 |
| 7,001,655 B2 * | 2/2006 | Kiyono et al. .............. 428/64.1 |
| 7,022,384 B2 | 4/2006 | Fujii et al. |
| 2002/0034603 A1 | 3/2002 | Nee |
| 2002/0122913 A1 | 9/2002 | Nee |
| 2003/0138591 A1 | 7/2003 | Nee |
| 2003/0215598 A1 | 11/2003 | Nee |
| 2004/0018334 A1 | 1/2004 | Nee |
| 2004/0028912 A1 | 2/2004 | Tauchi et al. |
| 2004/0151866 A1 | 8/2004 | Nee |
| 2004/0151867 A1 | 8/2004 | Nee |
| 2004/0191463 A1 | 9/2004 | Nee |
| 2004/0226818 A1 | 11/2004 | Takagi et al. |
| 2004/0238356 A1 | 12/2004 | Matsuzaki et al. |
| 2004/0258872 A1 * | 12/2004 | Nee .......................... 428/64.4 |
| 2004/0263984 A1 | 12/2004 | Nakai et al. |
| 2005/0008883 A1 | 1/2005 | Takagi et al. |
| 2005/0042406 A1 | 2/2005 | Nee |
| 2005/0079444 A1 * | 4/2005 | Kiyono et al. ......... 430/270.13 |
| 2005/0112019 A1 | 5/2005 | Nakai et al. |
| 2005/0153162 A1 | 7/2005 | Takagi et al. |
| 2005/0170134 A1 | 8/2005 | Nee |
| 2005/0238839 A1 | 10/2005 | Takagi et al. |
| 2005/0287333 A1 | 12/2005 | Takagi et al. |
| 2006/0013988 A1 | 1/2006 | Tauchi et al. |
| 2006/0104853 A1 | 5/2006 | Tauchi et al. |
| 2006/0154104 A1 | 7/2006 | Tauchi et al. |
| 2006/0171842 A1 | 8/2006 | Tauchi et al. |
| 2006/0177768 A1 | 8/2006 | Tauchi et al. |
| 2006/0182991 A1 | 8/2006 | Tauchi et al. |
| 2006/0234001 A1 | 10/2006 | Tauchi et al. |
| 2007/0026187 A1 | 2/2007 | Obata et al. |
| 2007/0141296 A1 | 6/2007 | Nakano et al. |

FOREIGN PATENT DOCUMENTS

| | | |
|---|---|---|
| JP | 4-252440 | 9/1992 |
| JP | 5-258363 | 10/1993 |
| JP | 6-208732 | 7/1994 |
| JP | 2000-57627 | 2/2000 |
| JP | 2001-184725 | 7/2001 |
| JP | 2003-160826 | 6/2003 |
| JP | 2004-158145 | 6/2004 |
| WO | WO98/09823 | 3/1998 |
| WO | WO 2005/056850 A1 | 6/2005 |

OTHER PUBLICATIONS

U.S. Appl. No. 12/266,065, filed Nov. 6, 2008, Tauchi, et al.
U.S. Appl. No. 12/100,823, filed Apr. 10, 2008, Tauchi, et al.
U.S. Appl. No. 12/167,597, filed Jul. 3, 2008, Takagi, et al.
U.S. Appl. No. 12/183,700, filed Jul. 31, 2008, Tauchi, et al.
U.S. Appl. No. 12/198,520, filed Aug. 26, 2008, Tauchi, et al.
U.S. Appl. No. 11/425,062, filed Jun. 19, 2006, Yuki Tauchi, et al.
U.S. Appl. No. 11/425,068, filed Jun. 19, 2006, Junichi Nakai, et al.
U.S. Appl. No. 11/428,045, filed Jun. 30, 2006, Hideo Fujii, et al.
U.S. Appl. No. 12/625,022, filed Nov. 24, 2009, Matsuzaki, et al.
U.S. Appl. No. 12/604,858, filed Oct. 23, 2009, Takagi, et al.

* cited by examiner

GENERATION OF NODE (1.4W)

50um

EXCELLENT CONDITION (3.4W)

50um

GENERATION OF RESIDUE (4.6W)

50um

P1=3.4W, P2=4.6W        EVALUATION: A

US 7,790,263 B2

AG ALLOY REFLECTIVE FILM FOR OPTICAL INFORMATION RECORDING MEDIUM, OPTICAL INFORMATION RECORDING MEDIUM AND AG ALLOY SPUTTERING TARGET FOR FORMING AG ALLOY REFLECTIVE FILM FOR OPTICAL INFORMATION RECORDING MEDIUM

FIELD OF THE INVENTION

The invention relates to an Ag alloy reflective film for an optical information recording medium, an optical information recording medium and an Ag alloy sputtering target for forming an Ag alloy reflective film for an optical information recording medium. In particular, in optical information recording media such as CDs, DVDs, Blu-ray Disks and HD-DVDs, in order to allow marking an identification number in accordance with, for instance, a BCA (Burst Cutting Area) standard by use of a laser in a production process of optical disks or after the formation of optical disks, the invention relates to a reflective film (layer) having low thermal conductivity, low melting temperature, high reflectance and high corrosion resistance, a sputtering target for forming the reflective films and an optical information recording medium including the reflective film.

BACKGROUND OF THE INVENTION

There are several types of optical disks and they are classified into three kinds of a play-only optical disk, a write-once optical disk and a rewritable optical disk, in accordance with the recording/reading methods.

Among these, as shown in FIG. 1, the play-only optical disk has a structure in which, after recording data are formed owing to patterned recording pits disposed on a transparent resin base (for instance, polycarbonate) during production, a reflective film layer containing Al, Ag or Au as a main ingredient is disposed. At the time of reading the data, phase difference or reflection difference of laser light irradiated on the disk is detected to reproduce the data. Furthermore, there is another type in which a base where individual recording pits are formed and then a reflective film layer is disposed thereon and a base on which a translucent reflective layer is disposed are adhered and data recorded in the two layers are read. When the recording/reading method is carried out on one surface, data are exclusively used for reading data (incapable of writing and changing), and, examples of optical disks adopting the above-mentioned method include CD-ROMs, DVD-ROMs, BD-ROMs and HD-DVD-ROMs. FIG. 1 is a schematic diagram showing a sectional structure. In FIG. 1, reference numerals 1, 2, 3, 4 and 5, show a polycarbonate base, a translucent reflective film layer (Au, Ag alloy, Si), an adhesive later, a total reflective film layer (Ag alloy) and a UV-curable resin protective layer, respectively.

In such play-only optical disks, disks are mass-produced by means of a press-forming method employing a stamper on which an information pattern is previously formed in the course of forming a disk. Accordingly, it has been difficult to provide an ID number for individual disks. However, in order to inhibit illegal copy of disks, to improve the traceability in a commodity circulation and to add an added value, disks provided with an ID number for individual disks by use of a dedicated unit during production of the disks or after formation of the disks come to be standardized by means of a label gate method or a BCA (Burst Cutting Area) method, in the play-only optical disks as well. At present, ID numbers are marked, mainly by a method in which laser light is irradiated on the produced disks to melt an Al alloy of a reflective film, followed by making a hole (void) in the reflective film to thereby carry out the recording.

As reflective films of the play-only optical disks, so far, Al alloys centering on JIS6061 (Al—Mg base alloy), which is much in a turn volume as a general structural material and accordingly less expensive, has been broadly used. Furthermore, recently, Ag alloys having high reflectance in comparison with that of the Al alloys have been under study. Ag alloy reflective films have been broadly used in recording optical disks such as DVD-Rs and CD-Rs.

However, these materials have a high thermal conductivity. Accordingly, when these materials are used in the play-only optical disks that are marked with laser, a higher laser power is necessary to mark, and therefore, there are problems in that the polycarbonate substrate that is a base and an adhesive are thermally damaged. Furthermore, when Ag alloy is used, since Ag is low in the heat resistance, there is a problem in that Ag film agglutinates at high temperatures to thereby lower the reflectance.

With regard to a decrease in the thermal conductivity of Ag alloy, JP-A-4-252440 discloses a method where Ge, Si, Sn, Pb, Ga, In, Tl, Sb or Bi is added to Ag to thereby lower the thermal conductivity. Further, JP-A-4-28032 discloses a method where Cr, Ti, Si, Ta, Nb, Pt, Ir, Fe, Re, Sb, Zr, Sn or Ni is added to Ag to thereby lower the thermal conductivity. However, the above-mentioned reflective films intend to inhibit heat from diffusing from a recording layer. Accordingly, since a function as the reflective film is lost when the reflective film itself is thermally modified, the reflective film is assumed not to be modified. On the other hand, in order to melt and remove a film by laser irradiation to thereby record a high quality signal, it is necessary that not only the absorptivity of the laser, the melting temperature and the thermal conductivity are optimized to reduce the recording power but also a melt region has to be controlled so that a shape thereof may be clear and a melt residue may not remain therein. However, an Ag alloy thin film satisfying the demand from a viewpoint of a mark shape during laser marking has not been obtained.

Patent document 1: JP-A-4-252440
Patent document 2: JP-A-4-28032

SUMMARY OF THE INVENTION

As described above, an Ag alloy reflective film to which the laser marking is applied is demanded to be capable of recording at a low recording power, excellent in a mark shape and high in the corrosion resistance.

The invention has been carried out in view of the above-mentioned situations and intends to provide an Ag alloy reflective film for an optical information recording medium to which laser marking can be easily applied, an optical information recording medium including the reflective film and a sputtering target for forming the reflective film.

The inventors have made intensive studies to achieve the object. Accordingly, the inventors have found that an Ag alloy thin film in which particular alloy elements are added to Ag at particular contents is a reflective film which allows readily applying the laser marking and is suitable as a reflective film for an optical information recording medium suitable for laser marking. The invention has been achieved based on such a finding, and, the object can be achieved according to the invention.

Namely, the invention relates to the following (1) to (14).

(1) An Ag alloy reflective film for an optical information recording medium, comprising:
Ag as a main component;
at least one kind of Nd, Gd, Y and Sm in a total amount of more than 0.1 atomic percent and not more than 3.0 atomic percent; and
at least one kind of W, Mo, V, Zr, Nb and Cr in a total amount of 3.0 to 10.0 atomic percent.

(2) The Ag alloy reflective film according to (1), which further comprises at least one kind of Sn and In in a total amount of 1.0 to 5.0 atomic percent.

(3) The Ag alloy reflective film according to (1), which has a film thickness of 10 to 50 nm.

(4) The Ag alloy reflective film according to (1), which is for use in a laser marking process.

(5) An optical information recording medium, comprising said Ag alloy reflective film according to (1).

(6) An Ag alloy reflective film for an optical information recording medium, comprising:
Ag as a main component;
at least one kind of Nd, Gd, Y and Sm in a total amount of more than 0.1 atomic percent and not more than 3.0 atomic percent; and
at least one kind of Ti and Ta in a total amount of 5.0 to 10.0 atomic percent.

(7) The Ag alloy reflective film according to (6), which further comprises at least one kind of Sn and In in a total amount of 1.0 to 5.0 atomic percent.

(8) The Ag alloy reflective film according to (6), which has a film thickness of 10 to 50 nm.

(9) The Ag alloy reflective film according to (6), which is for use in a laser marking process.

(10) An optical information recording medium, comprising said Ag alloy reflective film according to (6).

(11) An Ag alloy sputtering target, comprising:
Ag as a main component;
at least one kind of Nd, Gd, Y and Sm in a total amount of more than 0.1 atomic percent and not more than 3.0 atomic percent; and
at least one kind of W, Mo, V, Zr, Nb and Cr in a total amount of 3.0 to 10.0 atomic percent.

(12) The Ag alloy sputtering target according to (11), which further comprises at least one kind of Sn and In in a total amount of 1.0 to 5.0 atomic percent.

(13) An Ag alloy sputtering target, comprising:
Ag as a main component;
at least one kind of Nd, Gd, Y and Sm in a total amount of more than 0.1 atomic percent and not more than 3.0 atomic percent; and
at least one kind of Ti and Ta in a total amount of 5.0 to 10.0 atomic percent.

(14) The Ag alloy sputtering target according to (13), which further comprises at least one kind of Sn and In in a total amount of 1.0 to 5.0 atomic percent.

According to the Ag alloy reflective film of the invention for an optical information recording medium, laser marking can be readily applied. The optical information recording medium of the invention includes the above-mentioned Ag alloy reflective film, whereby the laser marking can be preferably applied in a play-only optical disk. According to the Ag alloy sputtering target of the invention for forming an Ag alloy reflective film for an optical information recording medium, the above-mentioned Ag alloy reflective film can be formed.

BRIEF DESCRIPTION OF THE DRAWINGS

FIG. 2A is a diagram showing a condition where a node is generated,
FIG. 2B is a diagram showing a condition where a residue is generated,
and FIG. 2C is a diagram showing an excellent condition.

EXPLANATION OF REFERENCE NUMERALS

Figure 1:
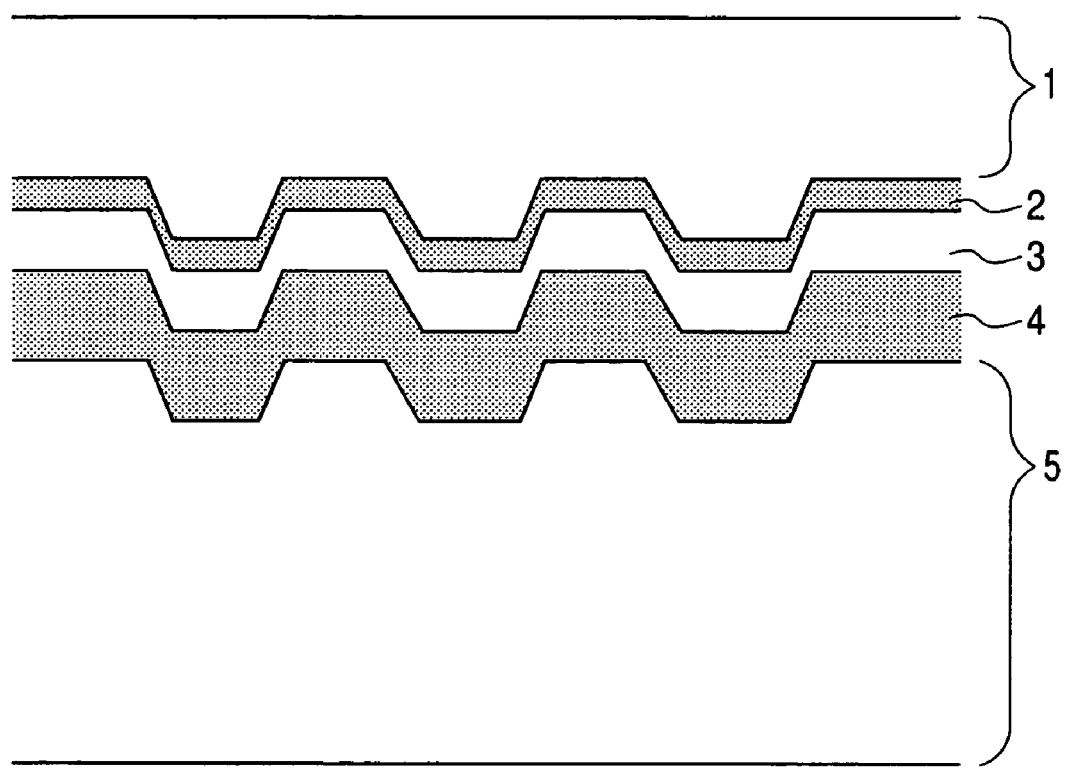
FIG. 1 is a schematic diagram showing a sectional structure of a play-only type optical disk.

1: polycarbonate base
2: translucent reflective film layer (Au, Ag alloy, Si)
3: adhesive layer
4: total reflective film layer (Ag alloy)
5: UV-curable resin protective layer

DETAILED DESCRIPTION OF THE INVENTION

The inventors have added various kinds of elements to Ag to prepare Ag alloy sputtering targets. The targets have been used to prepare Ag alloy thin films having various kinds of components and compositions according to a sputtering method. The compositions and the characteristics as the reflective film have been investigated for thereby finding the followings.

In order to reduce a recording power in the course of applying laser marking, it is necessary that the laser light absorptivity of the Ag alloy thin film is increased and the thermal conductivity of the thin film is lowered to efficiently make use of laser energy in melting the Ag alloy thin film. Furthermore, in order to melt the Ag alloy thin film, it is not preferable to increase the melting temperature thereof, and it is necessary to suppress the increase of the melting temperature thereof.

Subsequently, in order to obtain an excellent marking shape, it is necessary that the thermal conductivity is lowered to inhibit heat from diffusing and thereby to allow only a portion irradiated by laser for melting and that liquid drops of molten Ag alloy are finely dispersed (i.e., liquid drops are inhibited from partially assembling or agglutinating). In general, since the molten Ag alloy has a low viscosity and large surface tension, it tends to agglutinate to form residues. The residue is known to cause noise when a signal is read from a marked portion. Accordingly, in order to improve the marking shape, it is necessary that the Ag alloy is inhibited from moving (movement of Ag element) and that the residues are uniformly dispersed (i.e., the residues are inhibited from partially assembling and agglutinating).

According to the Ag alloy reflective film of the invention, when at least one kind of Nd, Gd, Y and Sm is added in a total amount of more than 0.1 atomic percent and not more than 3.0 atomic percent, the thermal conductivity can be lowered and the optical absorption can be increased without raising the melting temperature (liquidus temperature), and, at the same time, the reflectance can be inhibited from lowering due to an agglutination phenomenon of Ag under high temperature and high humidity. Furthermore, since these elements inhibit Ag from agglutinating, it is considered that the residues are inhibited from growing coarse. An addition amount of the elements necessarily exceeds 0.1 atomic percent (hereinafter, referred to as at % as well) in total, and the larger the addition amount is, the larger the advantage is. On the other hand, when these elements are excessively added, the durability is deteriorated and the reflectance is lowered. Accordingly, the addition amount is necessary to be 3.0 atomic percent or less in total. As a result, it is preferable that the addition amount is set in the range of more than 0.1 atomic percent and not more than 3.0 atomic percent in total. Further, the addition amount is more preferably in the range of 0.2 to 3.0 atomic percent and still more preferably in the range of 0.5 to 1.5 atomic percent.

When at least one kind of W, Mo, V, Zr, Nb and Cr is added in a total amount of 3.0 to 10.0 atomic percent or at least one kind of Ti and Ta is added in a total amount of 5.0 to 10.0 atomic percent simultaneously with the above-mentioned elements, the residues are improved in the dispersion state and the mark shape can be improved. Since an Ag alloy in which the elements are added has a melting temperature higher than the melting temperature of Ag and can be nuclei of solid phase formation, it is considered that the residues are advantageously effectively dispersed finely. When at least one kind of W, Mo, V, Zr, Nb and Cr is added, an addition amount thereof is necessarily set in total at 3.0 atomic percent or more, and when at least one kind of Ti and Ta is added, an addition amount thereof is necessarily set in total at 5.0 atomic percent or more. The larger the addition amount of the elements is, the larger the advantage is. However, as the addition amount thereof increases, the melting temperature of the Ag alloy thin film goes up and the reflectance goes down. Accordingly, excessive addition thereof has to be avoided. That is, when at least one kind of W, Mo, V, Zr, Nb and Cr is added, the addition amount thereof is necessarily set in total at 10.0 atomic percent or less, and accordingly, in total in the range of 3.0 to 10.0 atomic percent. When at least one kind of Ti and Ta is added, the addition amount thereof is necessarily set in total at 10.0 atomic percent or less, and accordingly, in total in the range of 5.0 to 10.0 atomic percent. When Ti is singularly added, the addition amount of Ti is desirably in the range of 6 to 10.0 atomic percent. When Ta is singularly added, the addition amount of Ta is desirably set in the range of 6 to 8.0 atomic percent. In the case of adding W singularly, the addition amount of W is desirably set in the range of 3.0 to 7.0 atomic percent. When at least one kind of Mo, V, Zr, Nb and Cr is added, the addition amount thereof is desirably set in total in the range of 4.0 to 10.0 atomic percent.

According to the Ag alloy reflective film of the invention, laser recording can be applied at a lower power, an excellent mark shape which is less in the melt residue in a recorded portion can be obtained, and high durability can be achieved. As the Ag alloy reflective film, those in which Nd or Gd and Ti, Ta or W are combined are particularly excellent in terms of the recording shape. Particularly, the addition amount of Nd and/or Gd is preferably in the range of 0.5 to 1.5 atomic percent and the addition amount of Ti, Ta and/or W is preferably in the range of more than 5.0 atomic percent (in particular, 6 atomic percent or more) and 10 atomic percent or less.

In order to further lower the recording power, it is effective to add at least one kind of Sn and In in a total amount of 1.0 to 5.0 atomic percent, in addition to the above-mentioned elements. When Sn and In are added, although the thermal conductivity can be lowered without deteriorating the reflectance and the durability, there is no advantage of suppressing the Ag alloy thin film from agglutinating under high temperature and high humidity. The addition amount of these elements may be set at 1.0 atomic percent or more in total, and the larger the addition amount is, the more advantageous it is.

However, when Sn and In are excessively added, the melting temperature of the Ag alloy thin film is lowered and a size of the residues becomes increased. Therefore, the addition amount thereof is preferably set in total at 5.0 atomic percent. Accordingly, addition amount thereof in total is preferably in the range of 1.0 to 5.0 atomic percent. It is more preferably set in the range of 1.0 to 3.0 atomic percent. According to the Ag alloy reflective film of the invention containing Sn and In, the recording power can be reduced while suppressing the reflectance from deterioration.

When a total of addition amounts of the above-mentioned elements (at least one kind of Nd, Gd, Y and Sm; and at least one kind of W, Mo, V, Zr, Nb and Cr or at least one kind of Ti and Ta; or further at least one kind of Sn and In) is controlled so that the optical absorptivity to laser light having a wavelength in 380 to 1000 nm may be 8% or more, desired laser marking characteristics can be obtained. Although a wavelength of a laser for use in laser marking is generally in the range of 800 to 810 nm, a laser having a wavelength in the range of 320 to 800 nm may be also used. In this regard, according to the Ag alloy reflective film of the invention, since the optical absorptivity increases as the wavelength decreases, the addition amount thereof can be reduced.

According to the Ag alloy reflective film of the invention, a film thickness thereof is preferably in the range of 10 to 50 nm. The reason is as follows. That is, while the laser marking is readily applied when a film thickness is thinner, the optical transmittance increases to reduce the reflectance. Accordingly, the film thickness is preferably 10 nm or more. On the other hand, when the film thickness is thicker, it is necessary to increase the energy given by laser in order to melt the Ag alloy reflective film and forming a mark comes to be difficult. Accordingly, the film thickness is preferably 50 nm or less. When the film thickness is set in the range of 10 to 50 nm, a recording shape can be formed more excellently.

The Ag alloy reflective film according to the invention for an optical information recording medium is used as a reflective film of a mono-layer or multi-layer medium of a play-only, write-once or rewritable optical disk that is classified into standards of DVD, BD and HD-DVD. The reflectance is stipulated according to the disk configuration and is substantially in the range of 35 to 70% in the play-only type and 18 to 30% in the rewritable type. The above-mentioned reflectance is that of a disk configuration including a protective layer and a translucent reflective layer or a recording layer and the reflectance of the thin film per se is necessarily about 50% or more. Furthermore, a film thickness thereof may be appropriately determined within a range of the standard of the disk. However, it is typically set in the range of 10 to 50 nm. Furthermore, it goes without saying that the reflective film according to the invention can be used in a translucent reflective film of an optical disk including two or more layers.

The Ag alloy reflective film according to the invention for an optical information recording medium is obtainable by forming an Ag alloy film having the above-mentioned alloy composition on a substrate by means of a layering method such as a sputtering method, a vacuum deposition method or an ion plating method. Among these, an Ag alloy reflective film obtainable by the sputtering method is preferable. This is because an Ag alloy reflective film formed by means of the sputtering method is excellent in a distribution of alloy components and the in-plane uniformity of film thickness in comparison with a thin film formed according to other layering methods, whereby higher-level characteristics (higher reflectance, surface flatness and higher durability) as the reflective film can be excellently extracted and optical information recording media having high performance and reliability can be produced.

An Ag alloy sputtering target according to the invention for forming an Ag alloy reflective film for an optical information recording medium contains Ag as a main component; at least one kind of Nd, Gd, Y and Sm in a total amount of more than 0.1 atomic percent and not more than 3.0 atomic percent and at least one kind of W, Mo, V, Zr, Nb and Cr in a total amount of 3.0 to 10.0 atomic percent. By employing the above-mentioned Ag alloy sputtering target of the invention, the Ag alloy reflective film of the invention for an optical information recording medium can be formed.

Another Ag alloy sputtering target according to the invention for forming an Ag alloy reflective film for an optical information recording medium contains Ag as a main component; at least one kind of Nd, Gd, Y and Sm in a total amount of more than 0.1 atomic percent and not more than 3.0 atomic percent and at least one kind of Ti and Ta in a total amount of 5.0 to 10.0 atomic percent. According to the above-mentioned Ag alloy sputtering target, an Ag alloy reflective film for an optical information recording medium can be also formed.

According to the Ag alloy sputtering target of the invention for forming an Ag alloy reflective film for an optical information recording medium, it is preferable that at least one kind of Sn and In is contained in total in the range of 1.0 to 5.0 atomic percent.

It is difficult to produce the Ag alloy sputtering target according to the invention for forming an Ag alloy reflective film for an optical information recording medium by melting and casting. Therefore, it is recommended to produce the Ag alloy sputtering target by means of a powder metallurgical method or a spray forming method. When a target is produced by means of the powder metallurgical method, a mixture of powders of the respective simple bodies of an Ag base and addition elements may be used, an alloy powder thereof may be used, or a mixture of an alloy powder and powders of simple bodies may be used. Furthermore, although a mosaic target obtained by combining an Ag base alloy and a block of addition element simple bodies may be used, it is more preferable to use the spray forming method and the powder metallurgical method. This is because an Ag alloy reflective film and a translucent reflective film are excellent in a distribution of alloy components and the in-plane uniformity of film thickness, in comparison with a thin film formed according to other layering methods, whereby higher-level characteristics (higher reflectance, higher surface flatness and higher durability) as the reflective film can be excellently extracted and optical information recording media having high performance and reliability can be produced.

The optical information recording medium according to the invention includes the above-mentioned Ag alloy reflective film for an optical information recording medium. The optical information recording medium allows applying the laser marking readily and preferably. Accordingly, the optical information recording medium has excellent characteristics in that there is no thermal damage of the materials constituting the disk (polycarbonate base and adhesive) owing to excessive laser output, and reflectance deterioration under conditions of high temperature and high humidity or upon exposing to sunlight or a fluorescent lamp hardly occurs.

Since the optical information recording medium according to the invention has excellent characteristics such as mentioned above, it can be preferably applied in laser marking in particular. When the optical information recording medium is used for laser marking as above, it is possible to record an identification mark on an Ag alloy reflective film by means of the laser marking method.

The Ag alloy reflective film according to the invention in an optical information recoding medium may be constituted of one layer or two or more layers. When two or more layers of the Ag alloy reflective film are formed, the compositions of respective layers may be totally different or partially different or utterly same.

It is sufficient that the optical information recording medium according to the invention is provided with the Ag alloy reflective film according to the invention, and can be used as a highly durable Ag alloy reflective film without particularly restricting other configurations as the optical information recording medium. However, the optical information recording medium according to the invention is particularly preferred in play-only disks, write-once disks and rewritable disks where recording on the reflective film is carried out by laser marking.

EXAMPLES

Examples of the invention and comparative examples will be described below. However, the invention is not limited to the examples and can be appropriately modified within a range that can adapt to the gist of the invention. All of these are included in a technical range of the invention. An Ag-A-B alloy is an Ag alloy containing A and B. An Ag-A-B-C alloy is an Ag alloy containing A, B and C. An Ag-xA-yB alloy is an Ag alloy containing A at x % (atomic percent) and B at y %. An Ag-xA-yB-zC alloy is an Ag alloy containing A at x % (atomic percent), B at y % and C at z %.

Preparation of Ag Alloy Thin Film

According to a DC magnetron sputtering method, an Ag alloy thin film was prepared on a polycarbonate substrate having a disc shape of a diameter of 12 cm by using a composite target in which chips of simple bodies of various kinds of additive elements are disposed on a pure Ag sputtering target. In this regard, the layering conditions in which substrate temperature was 22° C., Ag gas pressure was 2 m Torr, layering speed was 5 nm/sec and back-pressure was smaller than $5 \times 10^{-6}$ Torr were employed. Furthermore, a film thickness of the Ag alloy was set to 40 nm.

A UV-curable resin was applied on the Ag alloy thin film, followed by irradiating UV-rays to coat a resin layer. Thereby, a sample for evaluation was prepared.

Evaluation Method

The reflectance of the Ag alloy thin film was measured at a wavelength of 405 nm from a polycarbonate substrate side by use of a spectrophotometer V-570 (trade name, produced by JASCO Corporation). The durability was evaluated with the reflectance after holding the sample at a temperature of 80° C. and the humidity of 90% RH for 100 hr (the reflectance (a) after the durability test] and the difference (a−b) between the initial reflectance, i.e., the reflectance after the layering (b) and the reflectance after the durability test (a).

Figure 2A:
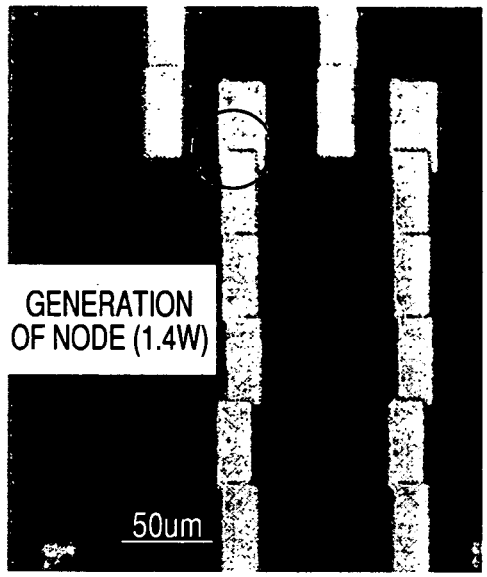
FIGS. 2A through 2C are diagrams showing examples of laser marked portions (shape).
Figure 2C:
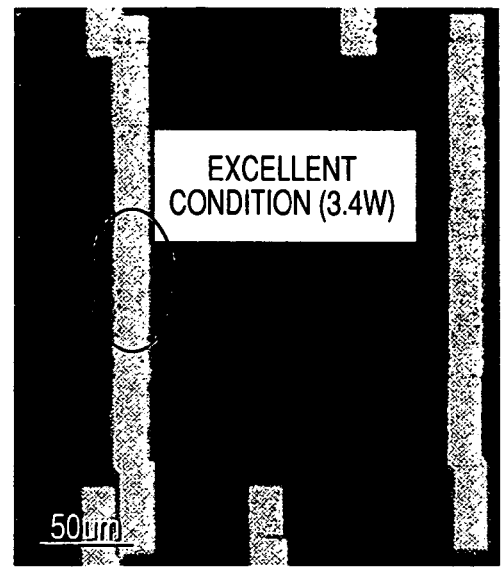
Figure 2B:
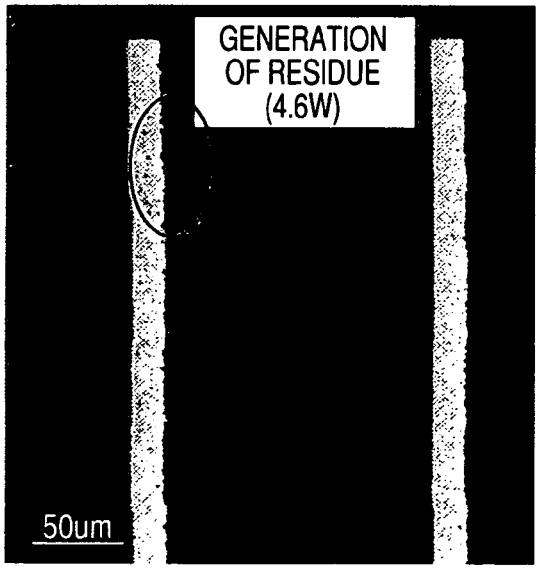

In evaluating a shape of the laser marking, POP-120-8R (trade name, produced by Hitachi Computer Equipment) was used and a random BCA pattern was recorded at a line speed of 6 m/s, followed by evaluating a marking state with an optical microscope. In FIGS. 2A through 2C, an evaluation example is shown. A bright portion in the drawing is a region where the Ag alloy thin film is melted and a dark portion in the bright portion is a residue. From the observation results, it is found that, although a portion that is not melted and shown as a node in the drawing remains (FIG. 2A) in the case that a recording power is low, the node disappears (FIG. 2B) as the recording power is increased, and a size of the residue increases (FIG. 2C) when the recording power is further increased. When the mark shape was evaluated, a power (P1) where the node disappears and a power (P2) where a size of the residue exceeds an upper limit size were measured. When 1.0 W≦P1≦4.0 W and (P2−P1)≧1.0 W were satisfied, it was judged that recording could be carried out at an appropriate recording power and the allowable range of recording power was sufficient, whereby judged as A (excellent). When the above conditions were not satisfied (either one of 1.0 W≦P1≦4.0 W and (P2−P1)≧1.0 W was not satisfied or both were not satisfied), it was judged as B (fault).

Example 1

In example 1, Ag—Nd—(Ti, Ta, W, Mo, V, Zr, Nb or Cr) thin films were prepared as Ag alloy thin film and evaluated in terms of the reflectance, durability and mark shape. Results are shown in Table 1.

It is found that in Ag—Nd—(Ti, Ta or W) thin films, as the amount of Ti, Ta or W increases, a power (P1) where the node disappears becomes lower and thereby a recording margin is expanded. Furthermore, a power (P2) where a size of the residue exceeds the upper limit size does hardly depend on the amount of Ti, Ta or W added, and, when a definite amount of the elements is contained, the mark shape can be improved. On the other hand, the reflectance becomes lower in all additive elements as an addition amount thereof is increased. Accordingly, it is found that the amount of an additive element is desirably suppressed in order to maintain the reflectance.

Test results of Ag alloy thin films shown in Table 1 will be detailed below. Ag alloy thin films of Nos. 1A through 5A are Ag—Nd—Ti thin films. Among these, with regard to an Ag—Nd—Ti thin film of No. 1A, since an amount of Ti is less than 5.0 atomic percent and the composition of the Ag alloy reflective film according to the invention is not satisfied, (P2−P1) is 0.2 W and (P2−P1)≧1.0 W is not satisfied, a judgment result of the mark shape is B (fault). Ag—Nd—Ti alloy thin films of Nos. 2A through 4A satisfy the composition of the Ag alloy reflective film according to the invention; accordingly, the durability is excellent and 1.0 W≦P1≦4.0 W and (P2−P1)≧1.0 W are satisfied, and judgment results of the mark shape are A (excellent). With regard to an Ag-alloy reflective film of No. 5A, an amount of Ti exceeds 10.0 atomic percent and does not satisfy the composition of the Ag alloy reflective film of the invention; accordingly, the reflectance after the durability test (a) is small, the difference (a−b) between the reflectance after the layering (b) and the reflectance after the durability test (a) is large and the durability is poor to be insufficient, that is, a result of comprehensive judgment is B (fault).

Ag alloy thin films of Nos. 6A through 9A are Ag—Nd—Ta thin films. Among these, with regard to an Ag—Nd—Ta thin film of No. 6A, since an amount of Ta is less than 5.0 atomic percent and the composition of the Ag alloy reflective film according to the invention is not satisfied, (P2−P1) is 0.8 W and (P2−P1)≧1.0 W is not satisfied, and a judgment result of the mark shape is B (fault). Ag—Nd—Ta alloy thin films of Nos. 7A through 9A satisfy the composition of the Ag alloy reflective film according to the invention; accordingly, the durability is excellent, 1.0 W≦P1≦4.0 W and (P2−P1)≧1.0 W are satisfied, and judgment results of the mark shapes are A (excellent).

Ag alloy thin films of Nos. 10A through 14A are Ag—Nd—W thin films. Among these, with regard to an Ag—Nd—W thin film of No. 10A, since an amount of W is less than 5.0 atomic percent and the composition of the Ag alloy reflective film according to the invention is not satisfied, (P2−P1) is 0.8 W and (P2−P1)≧1.0 W is not satisfied, and a judgment result of the mark shape is B (fault). Ag—Nd—W alloy thin films of Nos. 11A through 14A satisfy the composition of the Ag alloy reflective film according to the invention; accordingly, the durability is excellent, 1.0 W≦P1≦4.0 W and (P2−P1)≧1.0 W are satisfied, and judgment results of the mark shapes are A (excellent).

Ag alloy thin films of Nos. 15A through 19A are Ag—Nd—(Mo, V, Zr, Nb or Cr) thin films. All of the thin films satisfy the composition of the Ag alloy reflective film according to the invention, are excellent in the durability and satisfy 1.0 W≦P1≦4.0 W and (P2−P1)≧1.0 W and results of judgment of the mark shapes are A (excellent).

Example 2

In example 2, Ag—(Nd, Gd, Y or Sm)—(Ti or Ta) thin films were prepared and evaluated of the reflectance, durability and mark shape. Results are shown in Table 2.

According to the Ag—(Nd, Gd, Y or Sm)—(Ti or Ta) thin films, it is found that as an amount of Nd increases, a power (P2) where a size of the residue exceeds the upper limit dramatically increases to improve the recording margin. This is considered to be corresponding that an addition of Nd or Gd inhibits the agglutination from occurring. On the other hand, as for the durability, it is found that when an amount of Nd exceeds 3.0 atomic percent the durability is remarkably deteriorated. Accordingly, an amount of Nd is necessarily limited to 3.0 atomic percent or less.

Test results of Ag alloy thin films shown in Table 2 will be detailed below. Ag alloy thin films of Nos. 1B through 6B are Ag—Nd—Ti thin films. Among these, with regard to an Ag—Nd—Ti thin film of No. 1B, since an amount of Nd is 0.1 atomic percent and the composition of the Ag alloy reflective film according to the invention is not satisfied, (P2−P1) is 0.6 W and (P2−P1)≧1.0 W is not satisfied, and a judgment result of the mark shape is B (fault). With regard to Ag—Nd—Ti alloy thin films of Nos. 2B through 5B, since the composition of the Ag alloy reflective film according to the invention is satisfied, the durability is excellent and 1.0 W≦P1≦4.0 W and (P2−P1)≧1.0 W are satisfied, and judgment results of the mark shapes are A (excellent). With regard to an Ag—Nd—Ti alloy thin film of No. 6B, since an amount of Nd exceeds 3.0 atomic percent and does not satisfy the composition of the Ag alloy reflective film of the invention, P1 is less than 0.1 W and 1.0 W≦P1≦4.0 W is not satisfied, and a judgment result of the mark shape is B (fault). In addition, the reflectance after the durability test (a) is small, the difference (a−b) between the reflectance after the layering (b) and the reflectance after the durability test (a) is large and the durability is poor to be insufficient, that is, a result of comprehensive judgment is B (fault).

Ag alloy thin films of Nos. 7B through 16B all satisfy the composition of the Ag alloy reflective film according to the invention, are excellent in the durability and satisfy 1.0 W≦P1≦4.0 W and (P2−P1)≧1.0 W, and results of judgment of the mark shapes are A (excellent).

Example 3

In example 3, Ag—Nd—(Ti, Ta or W)—(Sn or In) thin films were prepared and evaluated of the reflectance, durability and mark shape. Results are shown in Table 3.

According to the Ag—Nd—(Ti, Ta or W)—(Sn or In) thin films, it is found that when an amount of Sn or In is increased, a power (P1) where a node disappears can be reduced and thereby a margin of the recording power can be effectively expanded. On the other hand, as an addition amount of Sn or In increases, a power (p2) where a size of the residue exceeds an upper limit size decreases. This is considered to be corresponding that since an Ag—Sn alloy is a eutectic alloy, a melting temperature is lowered to lower the viscosity and thereby agglutination tends to occur when the eutectic alloy is added. When Sn or In is added by 7.0 atomic percent, a power (P1) where the node disappears is such small as less than 1.0 W. It is found out that an addition amount of Sn or In is desirably 5.0 atomic percent or less and more desirably 3.0 atomic percent or less.

Test results of the Ag alloy thin films shown in Table 3 will be detailed below. Ag alloy thin films of Nos. 2C through 5C are Ag—Nd—Ti—Sn thin films. Among these, all of Ag—Nd—Ti—Sn alloy thin films of Nos. 2C through 4C satisfy the composition of the Ag alloy reflective film according to the seventh invention of the invention, are excellent in the durability and satisfy $1.0\ W \leqq P1 \leqq 4.0\ W$ and $(P2-P1) \geqq 1.0\ W$, and judgment results of the mark shapes are A (excellent). With regard to an Ag—Nd—Ti alloy thin film of No. 5C, an amount of Sn exceeds 5.0 atomic percent and does not satisfy the composition of the Ag alloy reflective film of the seventh invention, P1 is less than 0.1 W and $1.0\ W \leqq P1 \leqq 4.0\ W$ is not satisfied, and a judgment result of the mark shape is B (fault). In addition, the reflectance after the durability test (a) is small, the difference (a–b) between the reflectance after the layering (b) and the reflectance after the durability test (a) is large and the durability is poor to be insufficient.

Ag alloy thin films of Nos. 6C through 9C are Ag—Nd—Ta—Sn thin films. Among these, all of Ag—Nd—Ta—Sn alloy thin films of Nos. 6C through 8C satisfy the composition of the Ag alloy reflective film according to the invention, are excellent in the durability and satisfy $1.0\ W \leqq P1 \leqq 4.0\ W$ and $(P2-P1) \geqq 1.0\ W$, and judgment results of the mark shapes are A (excellent). With regard to an Ag—Nd—Ta—Sn alloy thin film of No. 9C, since an amount of Sn exceeds 5.0 atomic percent and does not satisfy the composition of the Ag alloy reflective film of the third invention of the invention, P1 is less than 0.1 and $1.0\ W \leqq P1 \leqq 4.0\ W$ is not satisfied, and a judgment result of the mark shape is B (fault). In addition, the reflectance after the durability test (a) is small, the difference (a–b) between the reflectance after the layering (b) and the reflectance after the durability test (a) is large and the durability is poor to be insufficient.

Ag alloy thin films of Nos. 10C through 13C are Ag—Nd—Ti—In thin films. Among these, all of Ag—Nd—Ti—In thin films of Nos. 10C through 12C satisfy the composition of the Ag alloy reflective film according to the invention, are excellent in the durability and satisfy $1.0\ W \leqq P1 \leqq 4.0\ W$ and $(P2-P1) \geqq 1.0\ W$, and judgment results of the mark shapes are A (excellent). With regard to an Ag—Nd—Ti—In alloy thin film of No. 13C, since an amount of In exceeds 5.0 atomic percent and does not satisfy the composition of the Ag alloy reflective film of the invention, P1 is less than 0.1 and $1.0\ W \leqq P1 \leqq 4.0\ W$ is not satisfied, and a judgment result of the mark shape is B (fault). In addition, the reflectance after the durability test (a) is small, the difference (a–b) between the reflectance after the layering (b) and the reflectance after the durability test (a) is large and the durability is poor to be insufficient.

All of Ag alloy thin films of Nos. 14C through 15C satisfy the composition of the Ag alloy reflective film according to the invention, are excellent in the durability and satisfy $1.0\ W \leqq P1 \leqq 4.0\ W$ and $(P2-P1) \geqq 1.0\ W$, and judgment results of the mark shapes are A (excellent).

TABLE 1

| | | Reflectance | | | Mark shape | | | |
| --- | --- | --- | --- | --- | --- | --- | --- | --- |
| No. | Composition | After Layering | After Durability Test | Difference | P1 | P2 | P2 – P1 | Judgment |
| 1A | Ag—0.7Nd—3.0Ti | 61.0 | 58.3 | −2.7 | 4.0 | 4.2 | 0.2 | B |
| 2A | Ag—0.7Nd—5.0Ti | 57.8 | 54.9 | −2.9 | 3.2 | 4.3 | 1.1 | A |
| 3A | Ag—0.7Nd—7.0Ti | 55.3 | 52.3 | −3.0 | 2.2 | 4.6 | 2.4 | A |
| 4A | Ag—0.7Nd—10.0Ti | 52.7 | 50.1 | −2.6 | 1.8 | 4.5 | 2.7 | A |
| 5A | Ag—0.7Nd—12.0Ti | 49.8 | 45.5 | −4.3 | 1.1 | 4.3 | 3.2 | A |
| 6A | Ag—0.7Nd—3.0Ta | 59.4 | 57.0 | −2.4 | 3.8 | 4.5 | 0.8 | B |
| 7A | Ag—0.7Nd—5.0Ta | 56.6 | 54.8 | −1.8 | 3.0 | 4.5 | 1.4 | A |
| 8A | Ag—0.7Nd—8.0Ta | 53.6 | 51.5 | −2.1 | 1.5 | 4.3 | 2.8 | A |
| 9A | Ag—0.7Nd—10.0Ta | 49.8 | 47.6 | −2.4 | 1.2 | 4.4 | 3.6 | A |
| 10A | Ag—0.7Nd—1.0W | 65.9 | 64.3 | −1.6 | 3.8 | 4.6 | 0.8 | B |
| 11A | Ag—0.7Nd—3.0W | 63.3 | 61.5 | −1.8 | 2.6 | 4.6 | 2.0 | A |
| 12A | Ag—0.7Nd—4.0W | 60.2 | 57.3 | −2.9 | 2.1 | 4.5 | 2.4 | A |
| 13A | Ag—0.7Nd—6.0W | 57.4 | 55.0 | −2.4 | 1.4 | 4.4 | 3.0 | A |
| 14A | Ag—0.7Nd—10.0W | 55.3 | 52.8 | −2.5 | 1.1 | 4.7 | 3.6 | A |
| 15A | Ag—0.7Nd—7.0Mo | 55.4 | 52.2 | −3.2 | 2.8 | 4.1 | 1.3 | A |
| 16A | Ag—0.7Nd—7.0V | 57.1 | 55.4 | −1.7 | 2.9 | 4.0 | 1.1 | A |
| 17A | Ag—0.7Nd—7.0Zr | 56.6 | 53.2 | −3.4 | 2.7 | 4.2 | 1.5 | A |
| 18A | Ag—0.7Nd—7.0Nb | 54.8 | 52.7 | −2.1 | 2.6 | 4.3 | 1.7 | A |
| 19A | Ag—0.7Nd—7.0Cr | 55.4 | 52.8 | −2.6 | 2.5 | 4.2 | 1.7 | A |

TABLE 2

| No. | Composition | Reflectance After Layering | Reflectance After Durability Test | Difference | Mark shape P1 | P2 | P2 − P1 | Judgment |
|---|---|---|---|---|---|---|---|---|
| 1B | Ag—0.1Nd—7.0Ti | 59.8 | 58.5 | −1.3 | 2.4 | 3.0 | 0.6 | B |
| 2B | Ag—0.5Nd—7.0Ti | 57.5 | 55.1 | −2.4 | 2.2 | 4.0 | 1.8 | A |
| 3B | Ag—0.7Nd—7.0Ti | 55.3 | 52.3 | −3.0 | 2.2 | 4.6 | 2.4 | A |
| 4B | Ag—1.5Nd—7.0Ti | 52.2 | 48.0 | −4.2 | 1.5 | 4.5 | 3.0 | A |
| 5B | Ag—3.0Nd—7.0Ti | 50.2 | 44.4 | −5.8 | 1.3 | 4.6 | 3.3 | A |
| 6B | Ag—5.0Nd—7.0Ti | 46.7 | 37.8 | −8.9 | <1.0 | 4.6 | >3.6 | B |
| 7B | Ag—0.7Gd—7.0Ti | 53.1 | 51.3 | −1.8 | 2.0 | 4.3 | 2.3 | A |
| 8B | Ag—0.7Y—7.0Ti | 54.6 | 52.6 | −2.0 | 2.3 | 4.4 | 1.9 | A |
| 9B | Ag—0.7Sm—7.0Ti | 56.0 | 53.6 | −2.4 | 2.4 | 4.4 | 2.0 | A |
| 10B | Ag—0.5Nd—6.0Ta | 56.8 | 54.8 | −2.0 | 2.8 | 4.6 | 1.8 | A |
| 11B | Ag—0.7Nd—6.0Ta | 55.4 | 53.0 | −2.4 | 2.5 | 4.6 | 2.1 | A |
| 12B | Ag—1.5Nd—6.0Ta | 52.1 | 48.9 | −3.2 | 2.0 | 4.4 | 2.4 | A |
| 13B | Ag—3.0Nd—6.0Ta | 50.6 | 45.8 | −4.8 | 1.4 | 4.3 | 2.9 | A |
| 14B | Ag—0.7Gd—6.0Ta | 53.4 | 52.0 | −1.4 | 2.4 | 4.4 | 2.0 | A |
| 15B | Ag—0.7Y—6.0Ta | 53.6 | 51.0 | −2.6 | 2.8 | 4.5 | 1.7 | A |
| 16B | Ag—0.7Sm—6.0Ta | 54.3 | 51.2 | −3.1 | 2.7 | 4.5 | 1.8 | A |

TABLE 3

| No. | Composition | Reflectance After Layering | Reflectance After Durability Test | Difference | Mark shape P1 | P2 | P2 − P1 | Judgment |
|---|---|---|---|---|---|---|---|---|
| 1C | Ag—0.7Nd—7.0Ti | 55.28 | 52.3 | −3.0 | 2.2 | 4.6 | 2.4 | A |
| 2C | Ag—0.7Nd—7.0Ti—1.0Sn | 54.64 | 51.4 | −3.2 | 2.0 | 4.6 | 2.6 | A |
| 3C | Ag—0.7Nd—7.0Ti—3.0Sn | 53.2 | 49.6 | −3.6 | 1.6 | 4.6 | 3.0 | A |
| 4C | Ag—0.7Nd—7.0Ti—5.0Sn | 51.8 | 47.7 | −4.1 | 1.2 | 4.4 | 3.2 | A |
| 5C | Ag—0.7Nd—7.0Ti—7.0Sn | 50.5 | 44.9 | −5.7 | <1.0 | 4.0 | >3.0 | B |
| 6C | Ag—0.7Nd—6.0Ta—1.0Sn | 54.8 | 52.0 | −2.8 | 2.7 | 4.5 | 1.7 | A |
| 7C | Ag—0.7Nd—6.0Ta—3.0Sn | 52.8 | 49.5 | −3.4 | 1.3 | 4.4 | 3.1 | A |
| 8C | Ag—0.7Nd—6.0Ta—5.0Sn | 51.7 | 47.4 | −4.4 | 1.1 | 4.5 | 3.4 | A |
| 9C | Ag—0.7Nd—6.0Ta—7.0Sn | 50.72 | 44.6 | −6.1 | <1.0 | 4.2 | >3.5 | A |
| 10C | Ag—0.7Nd—7.0Ti—1.0In | 54.4 | 52.4 | −2.0 | 2.1 | 4.5 | 2.4 | A |
| 11C | Ag—0.7Nd—7.0Ti—3.0In | 52.9 | 50.7 | −2.3 | 1.4 | 4.3 | 2.9 | A |
| 12C | Ag—0.7Nd—7.0Ti—5.0In | 50.7 | 47.6 | −3.1 | 1.1 | 4.0 | 2.9 | A |
| 13C | Ag—0.7Nd—7.0Ti—7.0In | 49.6 | 45.4 | −4.2 | <1.0 | 3.9 | >2.9 | B |
| 14C | Ag—0.7Nd—6.0Ta—2.0In | 54.1 | 51.1 | −3.0 | 2.8 | 4.3 | 1.5 | A |
| 15C | Ag—0.7Nd—5.0W—2.0Sn | 55.3 | 52.6 | −2.7 | 3.0 | 4.6 | 1.6 | A |

While the invention has been described in detail and with reference to specific embodiments thereof, it will be apparent to one skilled in the art that various changes and modifications can be made therein without departing from the scope thereof.

This application is based on Japanese patent application No. 2005-368130 filed Dec. 21, 2005, the entire contents thereof being hereby incorporated by reference.

What is claimed is:

1. An Ag alloy reflective film for an optical information recording medium, comprising:
   Ag as a main component;
   at least one kind of Nd, Gd, Y and Sm in a total amount of more than 0.1 atomic percent and not more than 3.0 atomic percent; and
   at least one kind of W, Mo, V, Zr, Nb and Cr in a total amount of 3.0 to 10.0 atomic percent.

2. The Ag alloy reflective film according to claim 1, which further comprises at least one kind of Sn and In in a total amount of 1.0 to 5.0 atomic percent.

3. The Ag alloy reflective film according to claim 1, which has a film thickness of 10 to 50 nm.

4. The Ag alloy reflective film according to claim 1, which is for use in a laser marking process.

5. An optical information recording medium, comprising said Ag alloy reflective film according to claim 1.

6. An Ag alloy reflective film for an optical information recording medium, comprising:
   Ag as a main component;
   at least one kind of Nd, Gd, Y and Sm in a total amount of more than 0.1 atomic percent and not more than 3.0 atomic percent; and
   at least one kind of Ti and Ta in a total amount of 5.0 to 10.0 atomic percent.

7. The Ag alloy reflective film according to claim 6, which further comprises at least one kind of Sn and In in a total amount of 1.0 to 5.0 atomic percent.

8. The Ag alloy reflective film according to claim 6, which has a film thickness of 10 to 50 nm.

9. The Ag alloy reflective film according to claim 6, which is for use in a laser marking process.

10. An optical information recording medium, comprising said Ag alloy reflective film according to claim 6.

11. An Ag alloy sputtering target, comprising:

Ag as a main component;

at least one kind of Nd, Gd, Y and Sm in a total amount of more than 0.1 atomic percent and not more than 3.0 atomic percent; and at least one kind of W, Mo, V, Zr, Nb and Cr in a total amount of 3.0 to 10.0 atomic percent.

12. The Ag alloy sputtering target according to claim 11, which further comprises at least one kind of Sn and In in a total amount of 1.0 to 5.0 atomic percent.

13. An Ag alloy sputtering target, comprising:

Ag as a main component;

at least one kind of Nd, Gd, Y and Sm in a total amount of more than 0.1 atomic percent and not more than 3.0 atomic percent; and at least one kind of Ti and Ta in a total amount of 5.0 to 10.0 atomic percent.

14. The Ag alloy sputtering target according to claim 13, which further comprises at least one kind of Sn and In in a total amount of 1.0 to 5.0 atomic percent.

* * * * *